United States Patent [19]

Wake et al.

[11] Patent Number: 5,419,990
[45] Date of Patent: May 30, 1995

[54] COLOR FILTER ARRAYS WITH OPTIMUM DYE DENSITY

[75] Inventors: Ronald W. Wake, Hilton; Sibylle L. Reithel, Ontario, both of N.Y.

[73] Assignee: Eastman Kodak Company, Rochester, N.Y.

[21] Appl. No.: 132,589

[22] Filed: Oct. 6, 1993

[51] Int. Cl.⁶ ................................................. G03F 9/00
[52] U.S. Cl. ........................................ 430/7; 430/941; 430/321
[58] Field of Search ............... 430/7, 518, 941, 321

[56] References Cited

U.S. PATENT DOCUMENTS

| | | | |
|---|---|---|---|
| 4,459,130 | 7/1984 | Helling et al. | 430/941 |
| 4,764,670 | 8/1988 | Pace et al. | 250/226 |
| 4,876,166 | 10/1989 | Wake et al. | 430/7 |
| 4,876,167 | 10/1989 | Snow et al. | 430/7 |
| 4,942,103 | 7/1990 | Reithel et al. | 430/7 |
| 4,943,515 | 7/1990 | Okazaki et al. | 430/270 |

Primary Examiner—Marion E. McCamish
Assistant Examiner—Laura Werner
Attorney, Agent, or Firm—Raymond L. Owens

[57] ABSTRACT

A color filter array is made by a method which uses a dye solution having a charge opposite to that of a mordant and an ionic component of the same charge as the dye solution.

6 Claims, No Drawings

COLOR FILTER ARRAYS WITH OPTIMUM DYE DENSITY

FIELD OF THE INVENTION

The present invention relates to color filter arrays, visual display units including color filter arrays, and sensors including color filter arrays.

BACKGROUND OF THE INVENTION

Image sensors are provided with sensing elements which provide a potential well or depletion region in a substrate. Color filter arrays having patterns of color are selectively formed over the sensing elements. Light passes through these colored patterns and causes charge to be collected in the potential wells.

Color filter arrays are presently fabricated on top of photoelectronic sensors by patterning a binder resin containing a mordant having a charge. The pattern is then subjected to a solution of a dye having the opposite charge. This results in dye incorporation into the pattern due to the binding of the oppositely charged species. The full color filter array requires multiple colors. Color filter arrays are generally classified into two types, i.e., primary color type filter array employing red, green, and blue (RGB), and complementary color type filter array employing white, yellow, and cyan (WYC), or white, yellow, cyan, and green (WYCG), or the like.

The image sensor is able to reproduce a color image by combining the signal levels from all the individual color sensing elements (pixels). Both the signal level and the known spectral sensitivity of the element are needed to accurately reproduce a color. It is advantageous to have the sensitivity of each element the same. Thus the red element is as sensitive to red light as the green element is sensitive to green light and so forth. The sensitivities can be matched electronically during the processing however this requires gain adjustments to each of the color channels. The gain adjustments introduce noise into the picture since both signal and noise are effected by gain adjustments. Therefore, it is advantageous to have the transmittance of the various filter elements be the same in their respective regions of the visible spectrum.

The level of transmittance is determined by both the amount of dye in the binder and the intrinsic absorptivity of the dye. The intrinsic absorptivity of a dye can not be changed therefore varying the amount of dye in the patterned binder is the only way of altering the transmittance. The amount of dye imbibed will be a function of the time the dye solution is left in contact with the binder and the total number of mordant sites in the binder. Stopping the dyeing process at some point short of saturation introduces a source of variability making it hard to accurately control the final dye density. Adjusting the number of mordant sites in the binder was used by Reithel and Sutton (U.S. Pat. No. 4,942,103). This method requires balancing the ratio of patterning component to mordant to obtain a compromise between photospeed, thickness, and dye density. It is likely using this method that a separate binder formulation will be needed for each dyed layer in a multilayer color filter. The preferred procedure is to saturate the binder with dye and control the transmittance by varying the thickness of the binder layer as is taught by Blood and Pace (U.S. Pat. No. 4,764,670). This can be done by controlling the spin speed used to coat the binder. This method is widely used and works quite well in most cases. However, there are cases where the desired thickness lies outside the range obtainable with spin coating equipment. If thicker coatings are needed, multiple layers could be coated however if thinner coatings are needed there are no reliable methods presently available. The lower thickness limit could also be dictated by the amount of surface topography present on the substrate containing the image sensor. Surface roughness will cause thickness non-uniformities in coatings applied by spinning. As the thickness decreases, the percent variability seen due to surface features interfering with the flow across the substrate surface increases. Thickness variations lead to dye density variations which will cause unacceptable color reproduction.

SUMMARY OF THE INVENTION

The object of this invention is to provide an improved color filter array which allows reduction in dye density below that obtainable by simply reducing the binder thickness.

This object is achieved in a method of making a color filter array, comprising the steps of:

a) providing a surface on which the color filter array can be formed;

b) forming a binder layer containing a mordant with charged mordant sites on the surface;

c) preparing a dye solution having a charge opposite to that of the mordant and an ionic component of the same charge as the dye, the relative concentrations of the dye and ionic component being predetermined; and d) immersing the mordant in the dye for a time sufficient to saturate all the mordant sites with dye and the ionic component so that the dye in the layer has a desired density.

This invention uses an ionic component in the dye solution which competes with the dye for the available mordant sites. The desired dye density is achieved by adjusting the relative concentrations of the ionic competitor and the dye and dyeing long enough so that all the mordant sites in the binder are occupied. In this manner a controllable dye density is achieved in a binder layer thick enough that it can be spin coated without significant thickness variations.

DETAILED DESCRIPTION OF THE INVENTION

The improved method of making a color filter array comprises the steps of fast providing a surface on which the color filter array can be formed. This surface can be that of a light sensitive semiconductor device for which the ability to distinguish colors is desired, a glass substrate, or any other surface on which there is need for a color filter. Next a binder layer is formed containing charged mordant sites on the surface. A solution is then prepared containing a dye having a charge opposite to that of the mordant and an ionic component of the same charge as the dye. The relative concentrations of the dye an ionic component being predetermined. The mordant layer is then immersed in the dye solution for a time sufficient to saturate all the mordant sites with dye or the ionic component so that the dye in the layer has a desired density. This procedure can then be repeated if more than one colored layer is needed for the color filter.

The binder resins used in the binder layer for manufacture of color filter arrays contain a material having a charged center which is capable of mordanting a dye with an oppositely charged center. These resins also are capable of being patterned by exposing with light then washing away the undesired areas with a suitable solvent. The remaining binder is then treated with a solution of dye. The dye diffuses into the binder and displaces the counterion at the charged center of the mordant. The counterions of both the mordant and dye will also form a complex which is usually washed out of the binder in subsequent processing. Suitable binders with mordanting sites are well known in the art and described in U.S. Pat. Nos. 4,764,670 (Pace and Blood), 4,876,167 (Snow, et al.), 4,943,515 (Reithel and Sutton), 4,876,166 (Wake, et al.), and references cited therein.

Control of dye density is very important for color filter arrays used in either image capture or display. There are two factors which determine the density of a dye, its absorptivity and the amount of the dye present. The absorptivity is an intrinsic characteristic of the dye and can not be changed appreciably. Another dye with a more appropriate absorptivity could be found but it likely will not have the same spectral characteristics and necessary stability. Thus, when a dye with the needed spectral and stability characteristics is found it is important to be able to imbibe it into the binder at a desirable density.

It is taught by Blood and Pace in U.S. Pat. No. 4,764,670 that it is best to fully saturate the binder with dye and alter the density by controlled thickness. This reduces the variability introduced by the dyeing process. However, it restricts the range of densities to those obtainable by controllable thickness changes in the binder. Spin coating of a solution of the binder in an appropriate solvent is the method which gives the most uniform thicknesses of binder layer across the substrate. The range of coating speeds that is usable is also limited due to coating quality and machine capability constraints. If thicknesses greater than these are required then either a more concentrated solution of binder or multiple coatings can be used. It is very rare that densities high enough are not obtainable by these standard techniques. However, when less dye density is required, problems may be encountered obtaining it with a controllable process. There is a minimum thickness, especially with imagers, that is dictated by the topography of the device. In order not to have severe thickness variations, a minimum thickness is required to smooth over existing topography.

This invention relates to a method whereby dye densities below those obtainable with standard procedures can be achieved in a controllable manner. This invention takes advantage of the fact that the dyeing process is a displacement of one ionic species for another in a stationary binder. The ionic dye and its counterion diffuse into the binder. At the mordant sites the ionic dye is preferentially bound to the oppositely charged mordant displacing the original counterion of the mordant. The displaced counterions from the dye and mordant, usually small hydrophilic species, are easily washed out of the binder. The dye solution is left in contact with the binder long enough for the dye to penetrate the entire layer and occupy all the mordant sites. Therefore, one of the ways to reduce the dye density in a given thickness of binder is to add a material (competitor) to the dye solution that effectively competes with the dye for the mordant sites. This material must have sufficient affinity for the mordant sites that it remains bound after the counterions are washed away. This means that it should have some lipophilic character. Also, since it remains in the color filter, it should have no visible color that would detract from the color quality of the color filter.

It has been found that salts of organic acids and organic quaternary ammonium salts effectively compete for mordant sites. The final density of the filter can be controlled by varying the ratio of dye to salt in the dyeing solution. Since the effectiveness of the competitor will depend on the structural details of all the components, the binder, the dye, and the competitor, some experimentation will be required to find one suitable for a given application. Specific mordant/dye systems for which this has been shown to work are described by Pace and Blood in U.S. Pat. No. 4,764,670 and Snow, et al. in U.S. Pat. No. 4,876,167 and references cited therein. However, the invention will work for any system that operates on the above mentioned ionic displacement mechanism.

Suitable competitors have the general structure:

$$R-X^--M^+$$

wherein:
R is aryl, aralkyl, or alkyl having 5 or more carbon atoms;
$X^-$ is an anion such as carboxylate, sulfonate, or phosphate; and
$M^+$ is a cation such as quaternary ammonium, potassium, or sodium.

Preferred competitors have the general structure

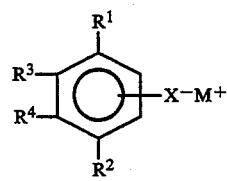

wherein:
$R^1$ and $R^2$ are the same or different and are hydrogen, aryl, aralkyl, alkaryl, or alkyl;
$R^3$ and $R^4$ are the same or different and are hydrogen, aryl, aralkyl, alkaryl, or alkyl or, together with the 2 carbon atoms to which they are attached, form an unsaturated or aromatic ring or ring system containing from 5 to 10 carbon atoms;
$X^-$ is an anion such as carboxylate, sulfonate, or phosphate; and
$M^+$ is a cation such as quaternary ammonium, potassium, or sodium.

Example 1

A binder formulation of diazo resin (1.0 gm), poly(N-vinylbenzyl-N,N-dimethyl-N-cyclohexyl ammonium chloride) (12.8 gm of a 12% aqueous solution), 85% aqueous solution of phosphoric acid (0.18 gm), a 50% aqueous solution of nonylphenoxypolyglycerol (0.6 gm), thiourea (0.08 gm), and deionized water (12.8 gm) was spin coated onto four inch glass wafers at 2000 rpm. The air-dried films were exposed with a 1000W Hg lamp, filtered to give a broad band (350–450 nm) intensity of 20 mW/cm$^2$, for 20 seconds and washed with deionized water for 20 seconds. These films were dyed to saturation using aqueous solutions of 0.4% ionic yellow dye and various amounts of 2-napthalene sodium sulfonate. The resulting densities are listed in Table 1.

TABLE 1

| Competitor Concentration (M) | Density |
|---|---|
| 0 | 2.0 |
| 0.01 | 1.9 |
| 0.05 | 1.4 |
| 0.1 | 1.0 |

Example 2

Coatings were made on four inch glass wafers by spin coating (2000 rpm) a solution containing 4.6 gm of a photocrosslinkable mordant described in U.S. Pat. No. 4,876,167 (16% aqueous solution), 0.06 gm of a ketocoumarin sensitizer, 0.02 gm of a 50% aqueous solution of nonylphenoxypolyglycerol, and 5.3 gm of deionized water. These coatings were exposed with a 1000 W Hg lamp, filtered to give a broad band (350–450 nm) intensity of 20 mW/cm$^2$, for 22 seconds. The films were developed for 30 seconds with an 80/20 mixture of n-butanol/methanol and dried for 2 minutes at 145° C. Dyeing was accomplished with a 0.2% solution of an ionic magenta dye in pH10 buffer with varying amounts of p-toluene sodium sulfonate. This was followed by metallization for 75 seconds with a 2% aqueous solution of nickel acetate. The resulting densities are listed in Table 2.

TABLE 2

| Competitor Concentration (M) | Density |
|---|---|
| 0.1 | 2.1 |
| 0.2 | 1.8 |
| 0.25 | 1.6 |
| 0.30 | 1.35 |

The invention has been described in detail with particular reference to certain preferred embodiments thereof, but it will be understood that variations and modifications can be effected within the spirit and scope of the invention.

We claim:

1. A method of making a color filter array, comprising the steps of:
   a) providing a surface on which the color filter array can be formed;
   b) forming a binder layer containing a mordant with charged mordant sites;
   c) preparing a dye solution containing both a dye component and a separate, ionic component each with a charge opposite that of the mordant, the relative concentrations of the dye component and ionic component being predetermined; and
   d) immersing the mordant in the dye solution for a time sufficient to saturate all the mordant sites with dye component and ionic component so that the dye component in the layer has a desired density.

2. The method of claim 1 wherein the mordant is cationic and the dye component and ionic component in the dye solution are both anionic.

3. The method of claim 2 wherein the ionic component is $$R-X^-M^+$$

wherein:
R is aryl, aralkyl, or alkyl having 5 or more carbon atoms;
X$^-$ is an anion such as carboxylate, sulfonate, or phosphate;
M$^+$ is a cation such as quaternary ammonium, potassium, or sodium.

4. The method of claim 2 wherein the ionic component is

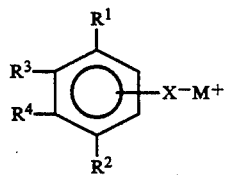

wherein:
R$^1$ and R$^2$ are the same or different and are hydrogen, aryl, aralkyl, alkaryl, or alkyl;
R$^3$ and R$^4$ are the same or different and are hydrogen, aryl, aralkyl, alkaryl, or alkyl or, together with the 2 carbon atoms to which they are attached, form an unsaturated or aromatic ring or ring system containing from 5 to 10 carbon atoms;
X$^-$ is an anion such as carboxylate, sulfonate, or phosphate; and
M$^+$ is a cation such as quaternary ammonium, potassium, or sodium.

5. The method of claim 1 wherein the binder layer is spin coated and the mordant is anionic and the dye component and ionic component in the dye solution and both cationic.

6. The method of claim 5 wherein the ionic component is

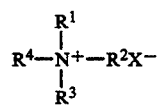

wherein:
R$^1$ and R$^2$ are the same of different and are aryl, aralkyl, or alkaryl having from 6 to about 10 carbon atoms or an alkyl group having from 1 to about 6 carbon atoms;
R$^3$ and R$^4$ are either both hydrogen or, together with the nitrogen atom form a saturated, unsaturated, or aromatic ring or ring system containing 5 to 10 carbon atoms such as piperidino, pyrrolidinyl, pyridinyl, or quinolinyl; and
X$^-$ is an anion such as halide, hexafluorophosphine, methosulfonate, or triflate.

* * * * *